US008102681B2

(12) United States Patent  
Ushijima

(10) Patent No.: US 8,102,681 B2
(45) Date of Patent: Jan. 24, 2012

(54) MEASUREMENT APPARATUS, TEST APPARATUS, AND MEASUREMENT METHOD

(76) Inventor: Masakazu Ushijima, Tokyo (JP)

(*) Notice: Subject to any disclaimer, the term of this patent is extended or adjusted under 35 U.S.C. 154(b) by 423 days.

(21) Appl. No.: 12/394,877

(22) Filed: Feb. 27, 2009

(65) Prior Publication Data
US 2009/0219007 A1 Sep. 3, 2009

(30) Foreign Application Priority Data

Feb. 29, 2008 (JP) .................. 2008-051178

(51) Int. Cl.
H02M 3/335 (2006.01)
(52) U.S. Cl. ............... 363/23; 363/24; 363/97; 363/133

(58) Field of Classification Search ............... 363/24, 363/25, 23, 97, 134, 133
See application file for complete search history.

(56) References Cited

U.S. PATENT DOCUMENTS
4,103,356 A * 7/1978 Finlay ........................... 363/22

FOREIGN PATENT DOCUMENTS
JP 2003-173884 A 6/2003
JP 2007-280796 A 10/2007
* cited by examiner Primary Examiner — Shawn Riley
(74) Attorney, Agent, or Firm — Chen Yoshimura LLP

(57) ABSTRACT

Provided is a transformer, comprising a first winding and a second winding that interlink with a main magnetic flux; and a third winding that interlinks with a magnetic flux leakage interlinking with only one of the first winding and the second winding.

27 Claims, 21 Drawing Sheets

MEASUREMENT APPARATUS, TEST APPARATUS, AND MEASUREMENT METHOD

CROSS REFERENCE TO RELATED APPLICATION

This patent application claims priority from a Japanese Patent Application No. 2008-051178 filed on Feb. 29, 2008, the contents of which are incorporated herein by reference.

BACKGROUND

1. Technical Field

The present invention relates to a transformer, an electric circuit, a current detecting method, and an output control method. In particular, the present invention relates to an electric circuit, a current detecting method, an output control method, and a transformer provided with a third winding suitable for controlling an output current of a secondary winding of the transformer.

2. Related Art

An inverter circuit for a discharge lamp that, when used in an LCD television or monitor, can emit light from the discharge lamp at several points using a simple circuit configuration is sought. An example of such a circuit is a so-called floating light-emitting circuit in which the terminals of a secondary winding in a magnetic flux leakage step-up transformer are connected to a cold-cathode lamp. Japanese Patent Application Publications No. 2007-280796 and No. 2003-173884 are attempts to monitor the state on a secondary side by providing a transformer with a third winding.

In a floating light-emitting circuit, however, there is no easy way to detect the lamp current flowing through the secondary winding of the step-up transformer, and therefore a current transformer or a photo-coupler is used to detect the lamp current. This increases the cost of the circuit. Furthermore, the monitoring of the secondary side by the inventions of the above patent applications does not go beyond simply monitoring the secondary-side voltage, and the secondary-side current cannot be monitored.

When increasing the number of lighting points in a discharge lamp, as appropriate for a backlight of an LCD device, the light emitting circuits are arranged in parallel. With this configuration, a current difference occurs between adjacent discharge lamps, causing the overall brightness to be uneven. To prevent this problem, the leakage inductance of the step-up transformer is increased to lower the Q value of each resonance circuit on the secondary side of the step-up transformer, thereby decreasing the spread of the lamp currents. Decreasing the Q values of the resonance circuits, however, increases the difference between the voltage phase and the current phase as viewed from the primary side of the step-up transformer. This worsens the power factor so that there is an increase in the ineffective current flowing through the primary winding of the step-up transformer, and also increases the heat generated by the switching elements in the step-up transformer.

Since a floating configuration involves driving two discharge lamps in series, the output voltage of the light emitting circuit is increased. This increases the number of turns in the secondary winding, thereby lowering the self-resonant frequency. When the self-resonant frequency is lowered, it becomes impossible to obtain the step-up ratio of the transformer, and the power factor as viewed from the primary winding side is worsened, increasing the heat generation. If the number of turns in the secondary winding is decreased in an attempt to decrease the heat generation, the leakage inductance on the secondary winding side drops. This results in the current at each lighting point being different, causing uneven brightness. In other words, a tradeoff must be made between uniform brightness and heat generation, and a technique is being sought to eliminate the need for such a tradeoff. There is a desire to measure the current flowing through a secondary-side circuit of a transformer not limited to circuits in a discharge lamp, and this measurement may also be desired for switching power sources, DC-DC converter circuits, inverter circuits, or the like.

SUMMARY

Therefore, it is an object of an aspect of the innovations herein to provide a transformer, an electric circuit, and a current detecting method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary transformer may comprise a first winding and a second winding that interlink with a main magnetic flux; and a third winding that interlinks with a magnetic flux leakage interlinking with only one of the first winding and the second winding.

According to a second aspect related to the innovations herein, one exemplary electric circuit may comprise a transformer that includes a first winding and a second winding that interlink with a main magnetic flux; and a third winding that interlinks with a magnetic flux leakage interlinking with only one of the first winding and the second winding; and a detecting section that detects one of a current and a voltage generated by the third winding.

According to a third aspect related to the innovations herein, one exemplary current detection method may include a method for measuring or controlling a current in the electric circuit according to the second aspect, based on at least one of a current and voltage generated by the third winding.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
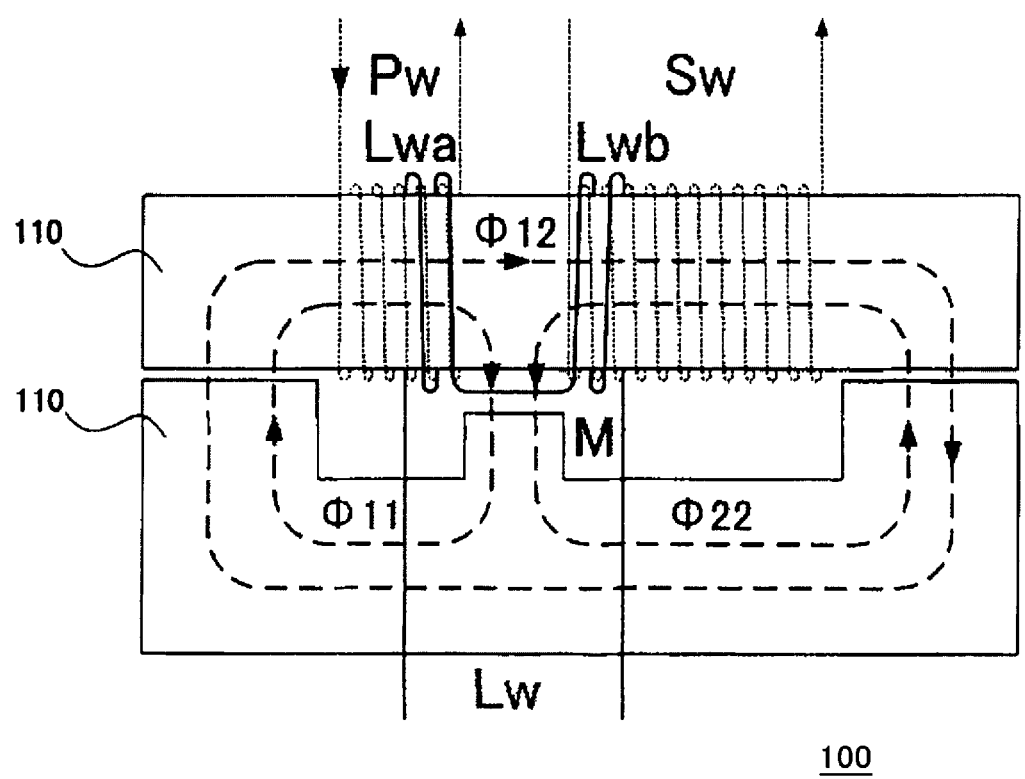
FIG. 1 shows an exemplary transformer 100 according to an embodiment.

FIG. 1 shows an example of a transformer 100 according to an embodiment of the present invention. The transformer 100 of the present embodiment is provided with a core 110, around which is wrapped a primary winding Pw, a secondary winding Sw, and a third winding Lw. The primary winding Pw is an example of a first winding, and may be a standard winding on a power supply side. The secondary winding Sw is an example of a second winding, and may be a standard winding on a load side. The primary winding Pw and the secondary winding Sw interlink with a main magnetic flux $\Phi 12$.

The third winding Lw may be positioned such that at least a portion thereof interlinks with (i) a first magnetic flux leakage $\Phi 11$ that interlinks with the primary winding Pw but not with the secondary winding Sw or (ii) a second magnetic flux leakage $\Phi 22$ that interlinks with the secondary winding Sw but not with the primary winding Pw. In FIG. 1, the third winding Lw includes (i) a first partial winding portion Lwa that interlinks with the main magnetic flux $\Phi 12$ and the first magnetic flux leakage $\Phi 11$ but not with the second magnetic flux leakage $\Phi 22$ and (ii) a second partial winding portion Lwb that interlinks with the main magnetic flux $\Phi 12$ and the second magnetic flux leakage $\Phi 22$ but not with the first magnetic flux leakage $\Phi 11$. The first partial winding portion Lwa and the second partial winding portion Lwb are wound in opposite directions. The first partial winding portion Lwa is wound around the same axis as the primary winding Pw, and the second partial winding portion Lwb is wound around the same axis as the secondary winding Sw.

The core 110 passes through the main magnetic flux $\Phi 12$, the first magnetic flux leakage $\Phi 11$, and the second magnetic flux leakage $\Phi 22$ to form a magnetic circuit. The core 110 may include a magnetic flux leakage section M so that the first magnetic flux leakage $\Phi 11$ and the second magnetic flux leakage $\Phi 22$ can occur more easily.

The main magnetic flux $\Phi 12$ is caused by the current flowing through the mutual inductance, and is related to the circuit voltage. Accordingly, only the circuit voltage is reflected in the detection winding to which the main magnetic flux $\Phi 12$ is applied. On the other hand, the first magnetic flux leakage $\Phi 11$ and the second magnetic flux leakage $\Phi 22$ are caused by the current flowing through the leak inductance, and are related to the circuit current. Accordingly, the magnetic flux leakage reflects the circuit current, so that it is possible to detect the circuit current by detecting the magnetic flux leakage.

In most transformers, including the transformer 100 of the present embodiment, the primary winding and the secondary winding are solenoids, and therefore the magnetic flux leakage is concentrated between the primary winding and the secondary winding. In other words, since an ideal solenoid does not allow a flux leakage from within the solenoid, the magnetic flux leakage is mostly concentrated between the primary winding and the secondary winding. If the discharge lamp uses a step-up transformer, however, the secondary winding has many turns, which lowers the self-resonant frequency. In this case, the secondary winding is expressed as a distributed constant to measure the magnetic flux leaking from within the secondary winding.

The transformer 100 of the present embodiment can detect the voltage proportional to the amount of magnetic flux leakage using the third winding Lw disposed between the primary winding Pw and the secondary winding Sw, as shown in FIG. 1. The amount of magnetic flux leakage basically reflects the circuit current and therefore the voltage generated by the third winding is proportional to the circuit current.

As described above, the third winding Lw is separated into two portions: the first partial winding portion Lwa and the second partial winding portion Lwb. The first partial winding portion Lwa is wound near the primary winding Pw, and the second partial winding portion Lwb is wound near the secondary winding Sw in a direction opposite that of the first partial winding portion Lwa. The voltage $E_{Lwa}$ generated by the first partial winding portion Lwa can be expressed by Expression 1, where the impedance of the first partial winding portion Lwa is $L_{Lwa}$.

$$E_{Lwa} = L_{Lwa} \times (\Delta\phi_{12}/\Delta t + \Delta\phi_{11}/\Delta t)$$ Expression 1:

The voltage $E_{Lwb}$ generated by the second partial winding portion Lwb can be expressed by Expression 2, where the impedance of the second partial winding portion Lwb is $L_{Lwb}$.

$$E_{Lw2} = L_{Lwb} \times (\Delta\phi_{12}/\Delta t - \Delta\phi_{22}/\Delta t) \quad \text{Expression 2:}$$

Assuming Lwa and Lwb have the same number of turns and the same impedance, the voltage generated by the main magnetic flux Φ12 cancels out, resulting in Expression 3.

$$\begin{aligned} E_{Lw} &= L_{Lwa} \times (\Delta\phi_{12}/\Delta t + \Delta\phi_{11}/\Delta t) - \\ & \quad L_{Lwb} \times (\Delta\phi_{12}/\Delta t - \Delta\phi_{22}/\Delta t) = \\ & \quad L_{Lwa} \times (\Delta\phi_{12}/\Delta t + \Delta\phi_{11}/\Delta t - \Delta\phi_{12}/\Delta t + \Delta\phi_{22}/\Delta t) = \\ & \quad L_{Lwa} \times (\Delta\phi_{11}/\Delta t + \Delta\phi_{22}/\Delta t) \end{aligned} \quad \text{Expression 3}$$

In other words, the third winding Lw generates a voltage $E_{Lw}$ that is proportional to the magnetic flux leakage component. The voltage $E_{Lw}$ generated by the third winding Lw is obtained by differentiating the temporal change of the magnetic flux leakage, and therefore has a phase that is 90 degrees ahead of the magnetic flux phase. Furthermore, the voltage $E_{Lw}$ generated by the third winding Lw directly reflects the amount of the magnetic flux leakage, i.e. the output current on the secondary winding Sw side, and therefore is equal to the output current on the secondary winding Sw side. As a result, the load current can be accurately controlled by measuring the voltage $E_{Lw}$ generated by the third winding Lw and, if adopted by a plurality of discharge lamps, can cause the light emitted by the discharge lamps to be uniform.

Figure 2:
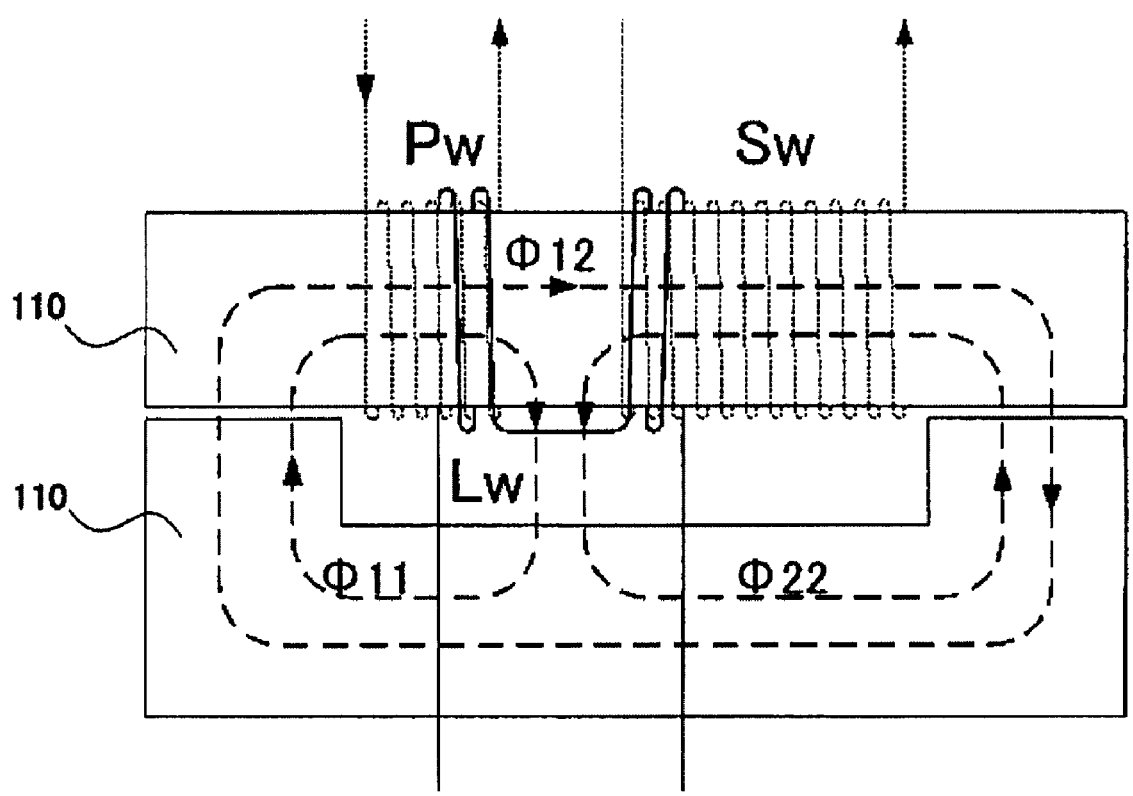
FIG. 2 shows an exemplary transformer 200 according to a modification of the embodiment.
Figure 3:
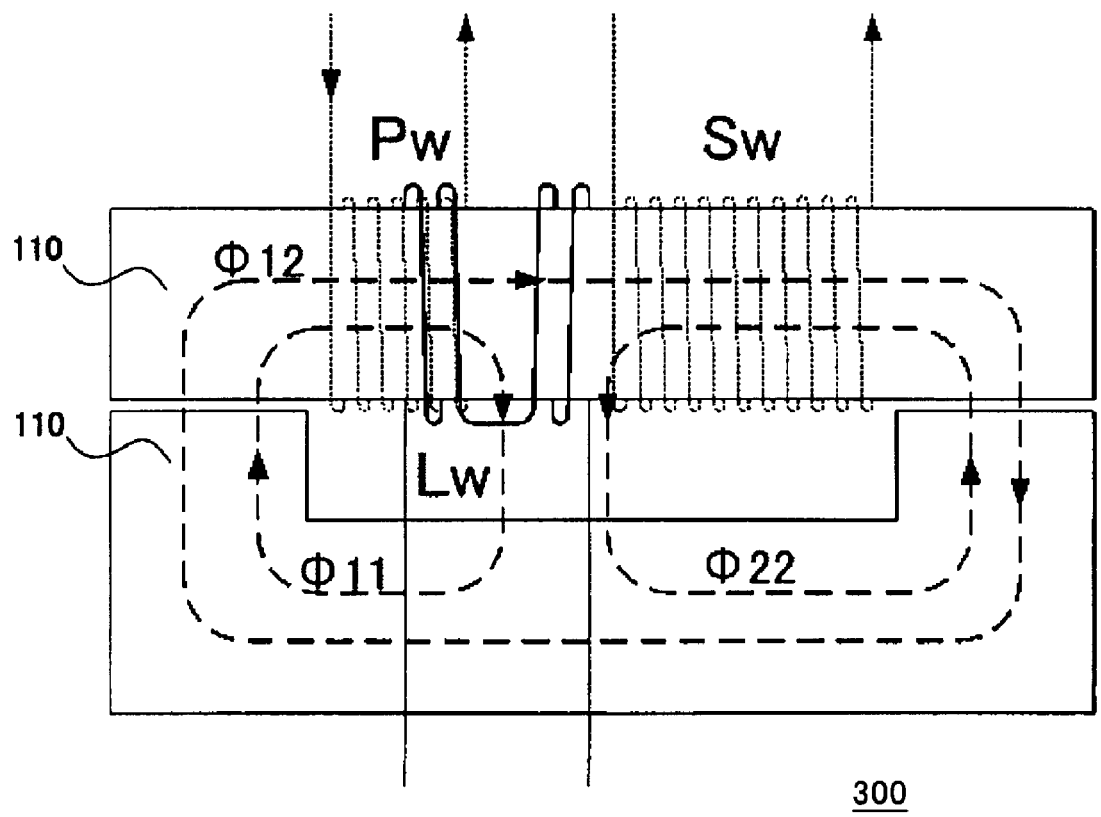
FIG. 3 shows an exemplary transformer 300 according to a modification of the embodiment.

The core 110 need not be provided with the magnetic flux leakage section M, as shown by the transformer 200 of FIG. 2. The second partial winding portion Lwb of the third winding Lw may be moved to a magnetic flux leakage and leakage generating section to detect the magnetic flux leakage near the primary winding Pw or to detect only a portion thereof, as shown in the transformer 300 of FIG. 3. In other words, the third winding Lw may include (i) the first partial winding portion Lwa that interlinks with the main magnetic flux Φ12 and the first magnetic flux leakage Φ11, but not with the second magnetic flux leakage Φ22 and (ii) a second partial winding portion Lwb that interlinks with the main magnetic flux Φ12, but not with the first magnetic flux leakage Φ11 or the second magnetic flux leakage Φ22. The first partial winding portion Lwa and the second partial winding portion Lwb may be wound in opposite directions.

In the case of the transformer 300, only the main magnetic flux Φ12 is cancelled out, resulting in Expression 4.

$$\begin{aligned} E_{Lw} &= L_{Lwa} \times (\Delta\phi_{12}/\Delta t + \Delta\phi_{11}/\Delta t) - L_{Lwb} \times (\Delta\phi_{12}/\Delta t) = \\ & \quad L_{Lwa} \times (\Delta\phi_{12}/\Delta t + \Delta\phi_{11}/\Delta t - \Delta\phi_{12}/\Delta t) = \\ & \quad L_{Lwa} \times (\Delta\phi_{11}/\Delta t) \end{aligned} \quad \text{Expression 4}$$

Figure 4:
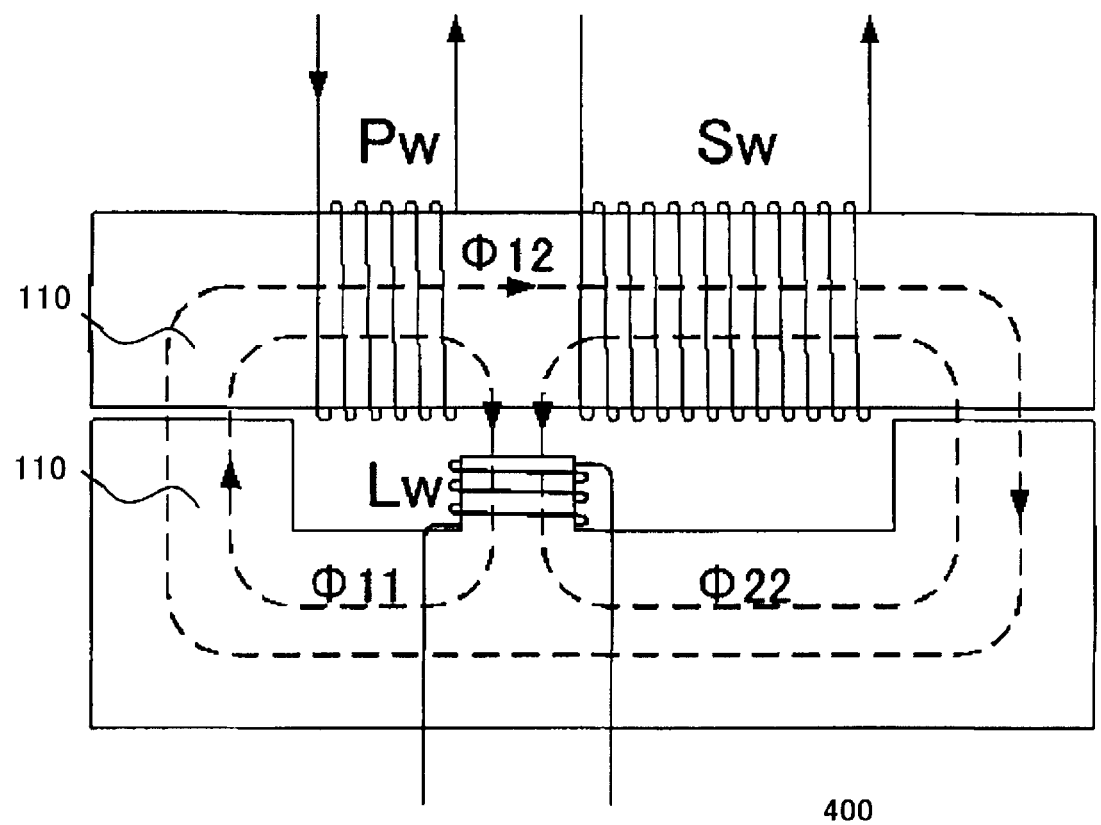
FIG. 4 shows an exemplary transformer 400 according to an embodiment.

FIG. 4 shows another exemplary transformer 400. The third winding Lw of the transformer 400 has a different arrangement than the third winding Lw in the transformer 100, the transformer 200, and the transformer 300. The third winding Lw of the transformer 400 is not wrapped around the same axis as the primary winding Pw and the secondary winding Sw, and is positioned to interlink with the first magnetic flux leakage Φ11 and the second magnetic flux leakage Φ22, but not with the main magnetic flux Φ12.

Since the location where most of the magnetic flux leaks from is the border between the primary winding Pw and the secondary winding Sw, as described above, the magnetic flux leakage on the secondary winding Sw side is basically concentrated at the border between the primary winding Pw and the secondary winding Sw, if we assume that the secondary winding Sw has absolutely no distributed constant characteristics. Accordingly, just the magnetic flux leakage can be measured by providing the third winding Lw at this location where most of the magnetic flux leakage is concentrated.

The voltage generated by the third winding Lw is generated by portions of the first magnetic flux leakage Φ11 and the second magnetic flux leakage Φ22 interlinking with the third winding Lw. Therefore, this voltage is proportional to the first magnetic flux leakage Φ11, the second magnetic flux leakage Φ22, and the impedance $L_{Lw}$ of the third winding Lw. In this case, since the amount of the magnetic flux leakage is proportional to the current flowing through the secondary winding Sw, the voltage generated by the third winding Lw is proportional to the voltage flowing through the load. If a capacitance component is connected to the secondary winding such that the capacitance component resonates with the leakage inductance of the secondary winding Sw, the voltage generated by the third winding Lw is proportional to the resonance current.

Figure 5:
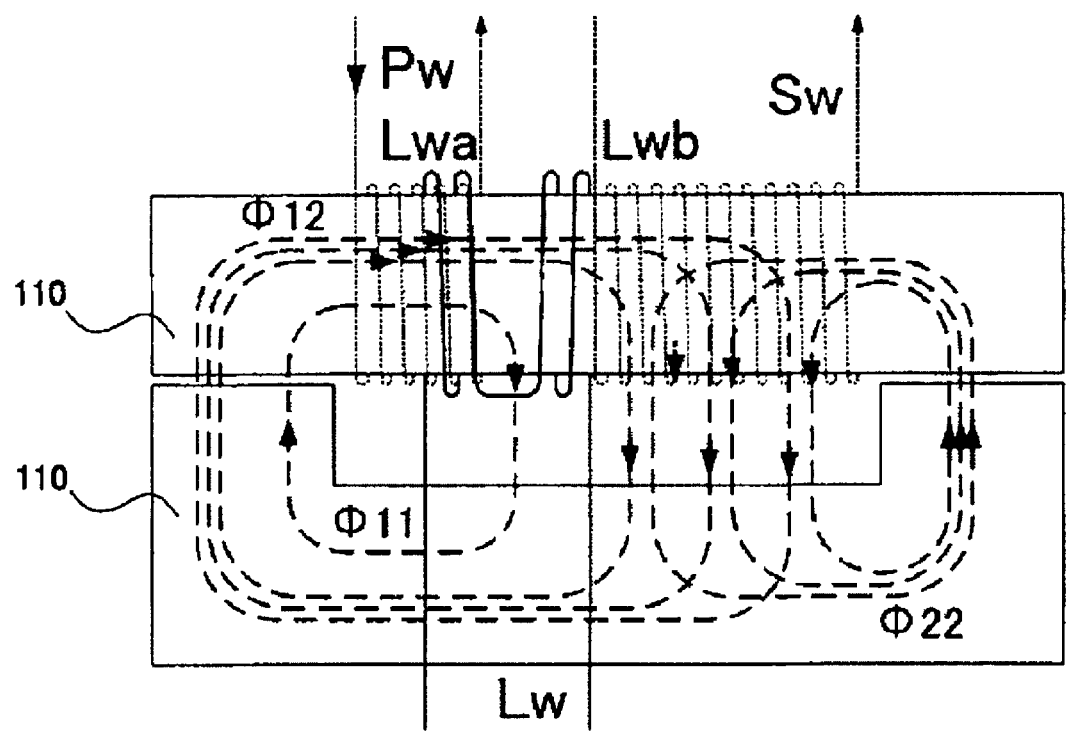
FIG. 5 shows an exemplary transformer according to an embodiment.

In most inverter circuits used in discharge lamps, the secondary winding Sw is formed as a distributed constant delay circuit. This type of distributed constant is especially prominent when the self-resonant frequency of the secondary winding Sw nears the operational frequency of the inverter circuit. In this case, since the magnetic flux leakage leaks from the all of the secondary winding, as shown in FIG. 5, it sometimes makes sense to obtaining only the first magnetic flux leakage Φ11 or a portion thereof for the operation of an inverter circuit.

Figure 6:
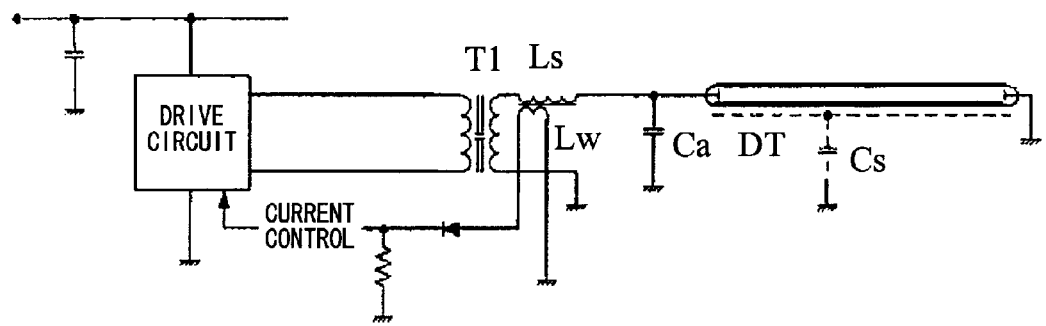
FIG. 6 is a circuit diagram showing an exemplary current detecting circuit.
Figure 7:
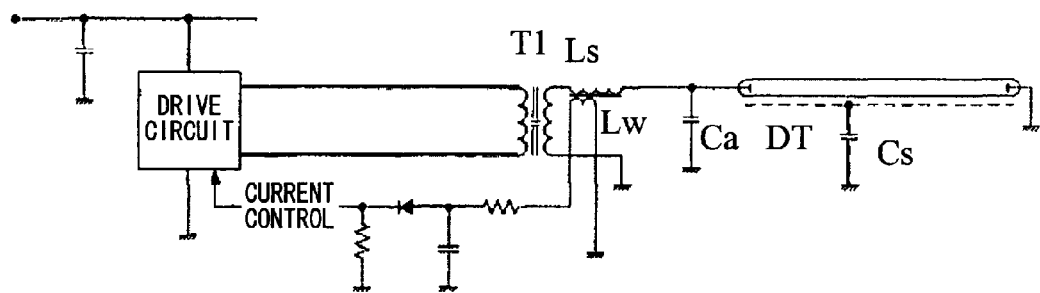
FIG. 7 is a circuit diagram showing another exemplary current detecting circuit.

The transformers described above cause the voltage generated by the third winding Lw to be proportional to the output current of the transformer, and therefore the output current of the transformer can be measured by detecting this voltage or current. FIG. 6 is a circuit diagram showing an exemplary current detecting circuit. The current detecting circuit uses the terminal voltage of the third winding Lw to control the current and create a feedback to a drive circuit, thereby controlling a primary voltage or a primary current of the transformer. The current generated by the third winding Lw sometimes includes a high-order oscillation waveform. In such a case, a CR filter may be provided, as shown in FIG. 7.

Since the voltage generated by the third winding Lw is proportional to the output current of the transformer, the phase or the output current of the transformer can be measured by detecting this voltage or current. The measured output current or phase can be used to accurately control the lamp current and the light emitted by the discharge lamp.

Figure 8:
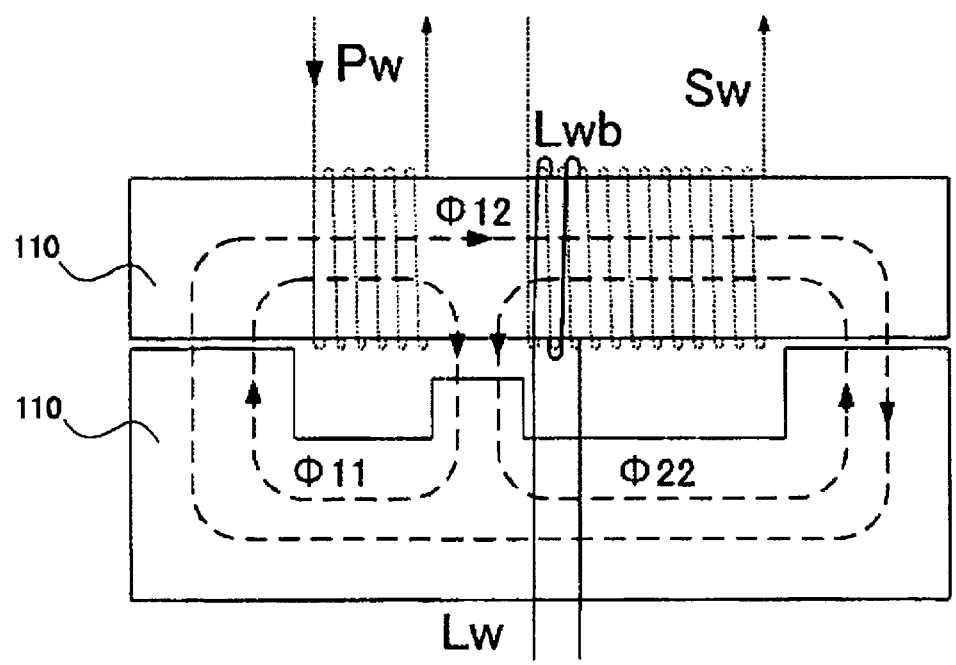
FIG. 8 shows an exemplary transformer 500 according to a modification of an embodiment.

When using a method in which the drive circuit is used as an AC ground at one end of the winding, e.g. a half bridge circuit or a switch snubber circuit, the same effect can be realized by using only the Lwb wound near the secondary winding Sw. FIG. 8 shows an exemplary transformer 500 according to a modification of the present embodiment. This modification uses, as the third winding Lw, only the second partial winding portion Lwb wound near the secondary winding Sw. In other words, the third winding Lw interlinks with the main magnetic flux Φ12 and the second magnetic flux leakage Φ22 but not with the first magnetic flux leakage Φ11.

Figure 9:
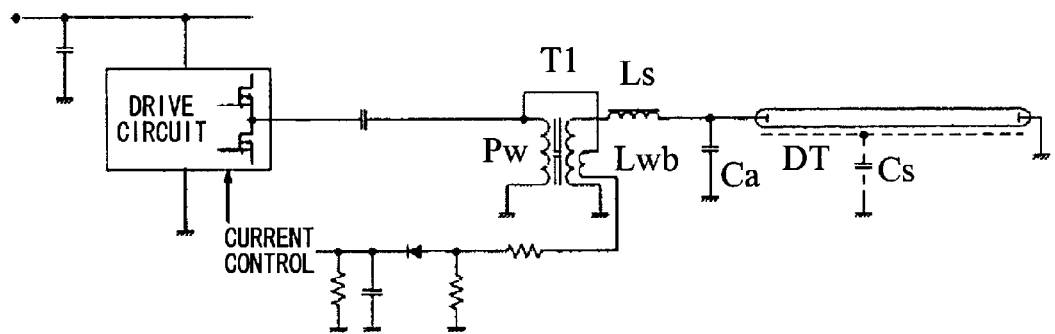
FIG. 9 is a circuit diagram showing another exemplary current detecting circuit.
Figure 10:
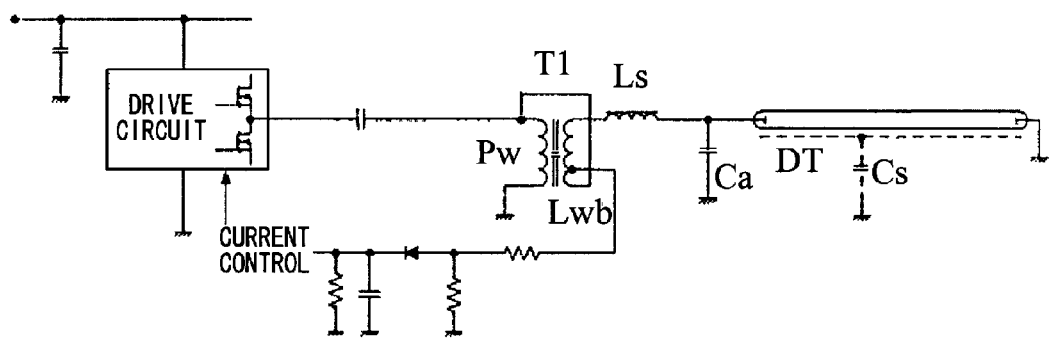
FIG. 10 is a circuit diagram showing another exemplary current detecting circuit.

In this case, the primary winding Pw also serves as the first partial winding portion Lwa. The second partial winding portion Lwb has the same number of turns as the primary winding Pw, and is wound in a direction opposite that of the primary winding Pw. When connected in series, as shown in FIG. 9, the voltage generated by the winding reflects the output current. The same effect can be achieved by providing a tap to set the Lwb as a portion of the secondary winding Sw, and connecting this as shown in FIG. 10.

Figure 11:
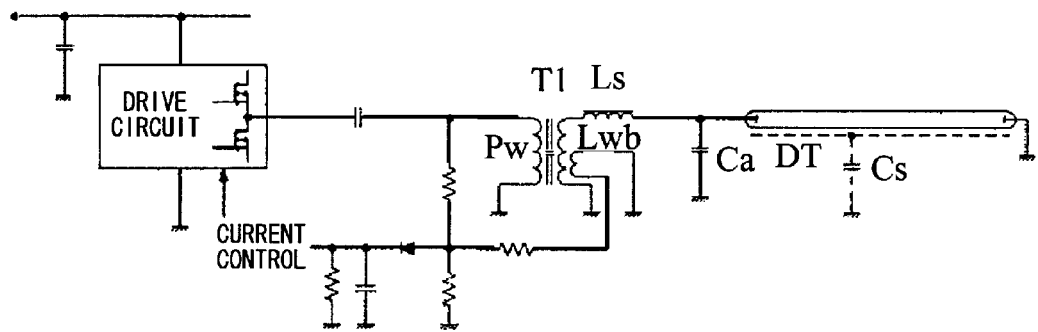
FIG. 11 is a circuit diagram showing another exemplary current detecting circuit.
Figure 12:
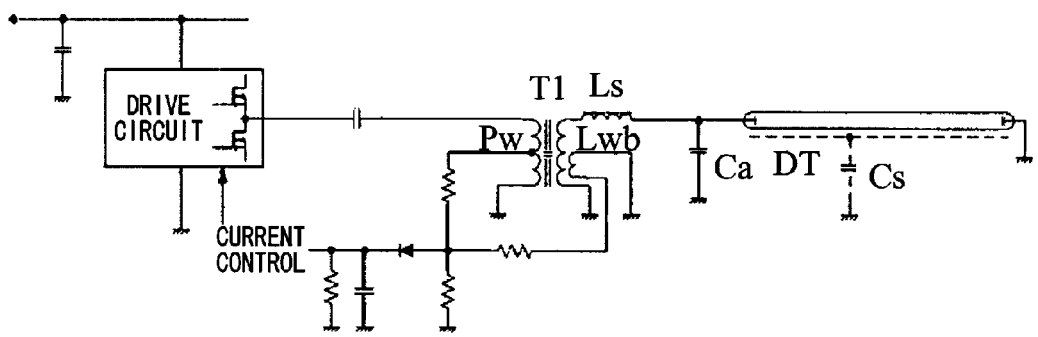
FIG. 12 is a circuit diagram showing another exemplary current detecting circuit.
Figure 13:
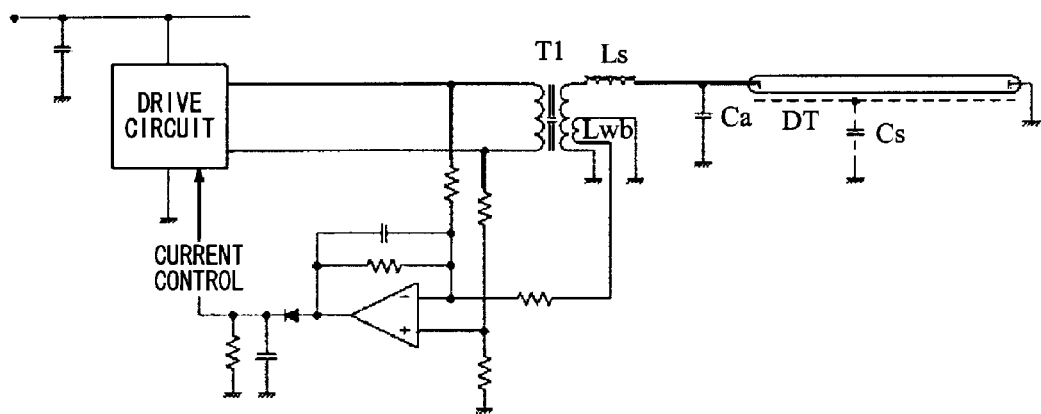
FIG. 13 is a circuit diagram showing another exemplary current detecting circuit.

The same result can also be achieved by using a more complicated mechanism such as a dividing resistor or an analog adding unit. FIG. 11 shows a circuit in which the voltage of the primary winding Pw, which serves as the Lwa, and the voltage of the Lwb are divided by a resistance. FIG. 12 shows a similar circuit in which a tap is provided to the primary winding to serve as the Lwa. Furthermore, it is obvious that an operational amplifier can be used to realize a similar detection circuit. The exemplary detection circuit shown in FIG. 13 uses a differential amplifier to obtain the voltage generated by the primary winding Pw, and can detect the output current by taking the difference between the obtained voltage and the voltage of the Lwb.

Figure 14:
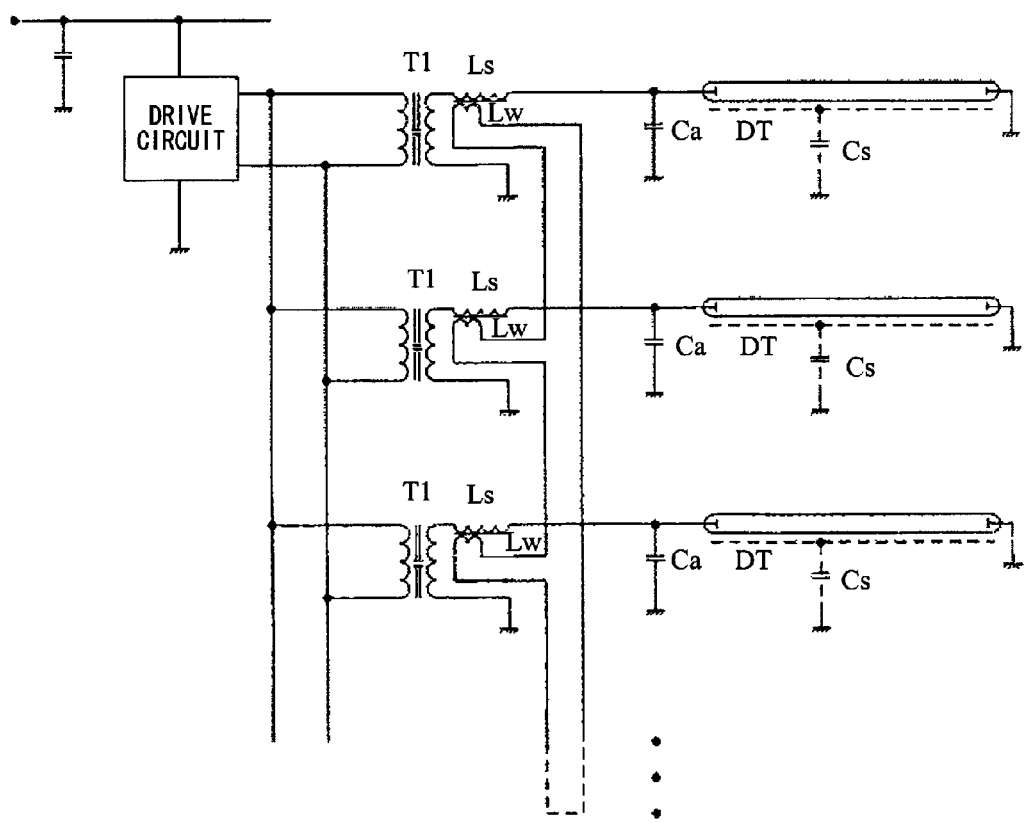
FIG. 14 shows an exemplary circuit formed by connecting the third windings of transformers according to the embodiments to create a closed loop.

FIG. 14 shows an exemplary circuit in which a transformer according to an embodiment of the present invention is adapted to drive a plurality of discharge lamps. In the circuit of FIG. 14, the third windings Lw of leakage inductance transformers are connected in series to each other to form a closed loop. By serially connecting the third windings Lw to form a closed loop, the output currents of the transformers can be kept uniform, so that the light emitted by the plurality of discharge lamps is kept uniform. Since the currents and voltages generated by the third windings Lw are proportional to the output currents of the transformers, the output current of each transformer can be made equal if the current generated by each third winding Lw is equal.

Figure 15:
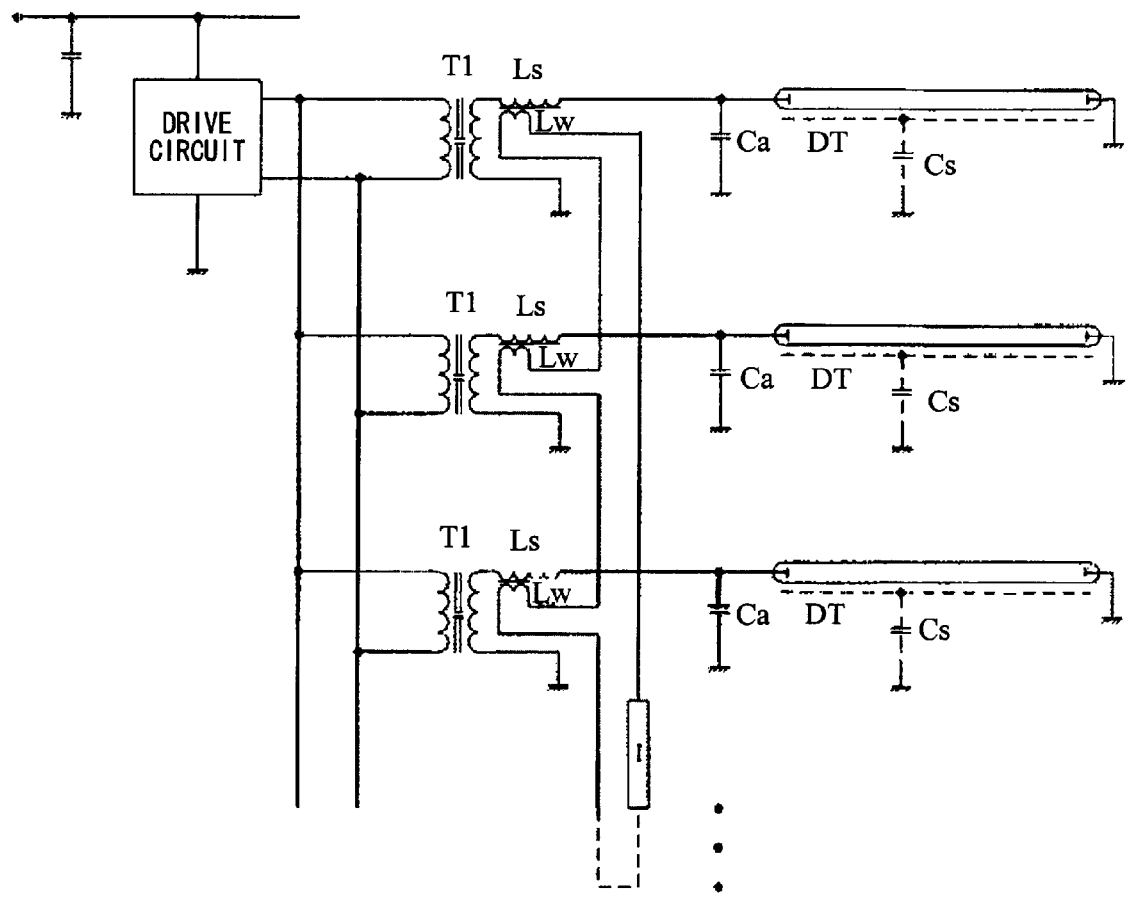
FIG. 15 shows the circuit of FIG. 14 with an impedance circuit inserted into a portion of the closed loop.

As shown in FIG. 15, a portion of the closed loop may include an impedance circuit I. The impedance circuit enables regulation of the strength of interactions of the third windings Lw. The impedance circuit can adopt any electric circuit elements, such as a resistor, a capacitor, or a choke coil. The strength of interactions of the third windings Lw can be regulated even if the number of turns of the first partial winding portions Lwa and the second partial winding portions Lwb, which are wound in opposite directions, are unbalanced.

Figure 16:
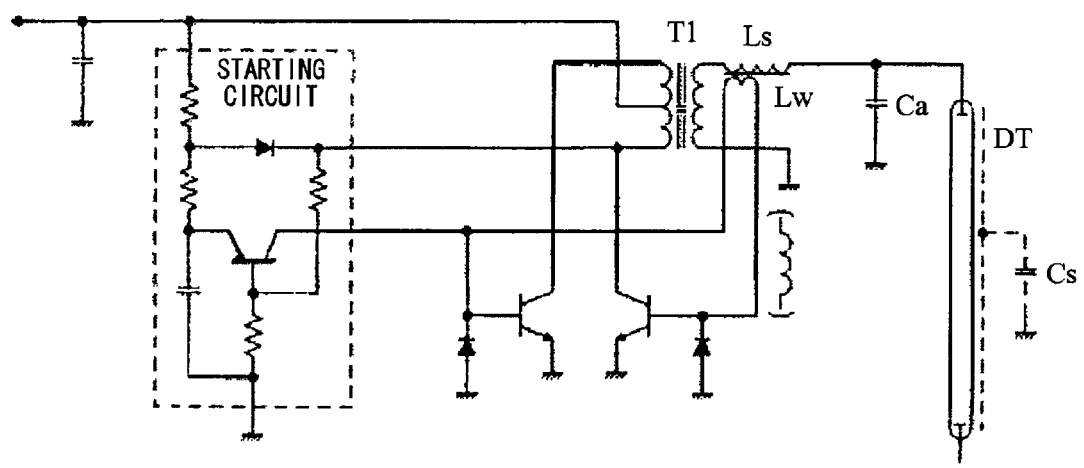
FIG. 16 shows an exemplary circuit provided with a control circuit for controlling the output in the transformers according to the embodiments.

FIG. 16 shows an exemplary circuit for controlling switching elements in the transformers according to the above embodiments. Since the phase of the current flowing through the third winding Lw is practically the same as the phase of the output current or the input current of the transformer, this current can be used to drive current-controlled switching elements. In other words, this circuit includes a circuit that obtain the output of the secondary winding Sw by using the voltage or current generated in the third winding Lw to control the primary winding Pw via the drive circuit.

The drive circuit includes a first switching element and a second switching element, which each have a pair of I/O terminals and a control terminal. A mid-point of the primary winding Pw is connected to a power source, one of the I/O terminals of the first switching element is grounded, and one of the I/O terminals of the second switching element is grounded. The other I/O terminal of the first switching element is connected to one of the terminals of the primary winding Pw, and the other I/O terminal of the second switching element is connected to the other terminal of the primary winding Pw. The control terminal of the first switching element is connected to one of the terminals of the third winding Lw, and the control terminal of the second switching element is connected to the other terminal of the third winding Lw.

Figure 17:
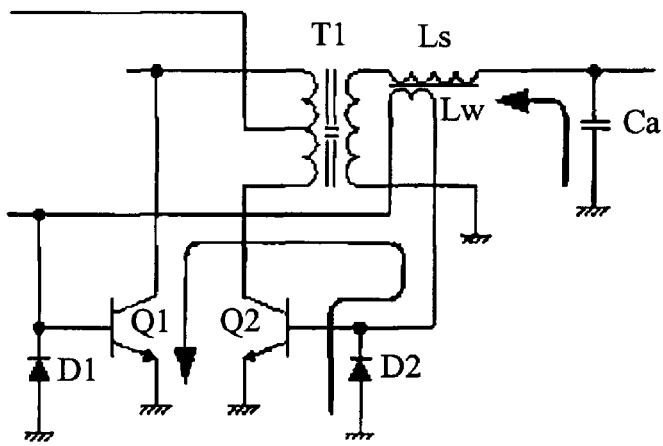
FIG. 17 shows the operation of the circuit shown in FIG. 16.
Figure 18:
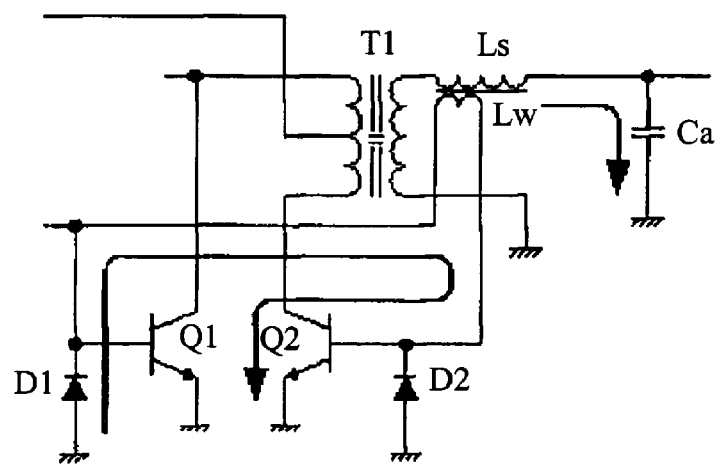
FIG. 18 shows the operation of the circuit shown in FIG. 16.

FIGS. 17 and 18 show operations of the circuit shown in FIG. 16. The current flowing through the third winding Lw has a phase that directly reflects the temporal change of the magnetic flux leakage, and this trait can be used to form a current resonance circuit. In other words, since the magnetic flux leakage reflects the current on the primary winding Pw side or the current on the secondary winding Sw side, the current of the third winding Lw reflects these currents. More specifically, the current of the third winding Lw reflects the current on the primary winding Pw side when the magnetic flux leakage generated from the primary side is greater, and reflects the current on the secondary winding Sw side when the magnetic flux leakage generated from the secondary side is greater.

The circuit of FIG. 16 uses the current flowing through the third winding Lw. Accordingly, the current flowing through the third winding Lw flows through the diode D2 when the transistor Q1 is turned on, as shown in FIG. 17, and therefore reflects the phase of the current flowing through the current resonance circuit formed by the leakage inductance Ls and the primary side capacitance. When the secondary-side resonance current inverts, the switching operation also inverts. As shown in FIG. 18, the current flowing through the third winding Lw flows through the diode D1 when the transistor Q2 is turned on.

Figure 19:
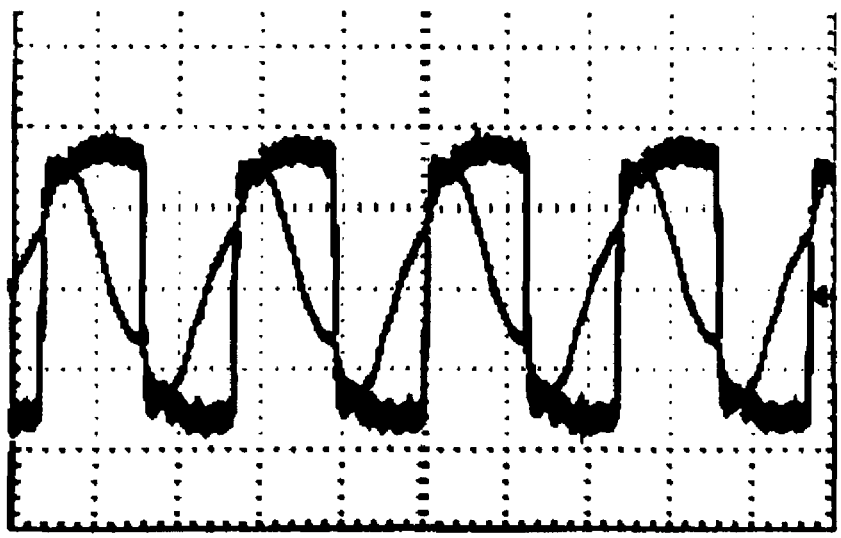
FIG. 19 is a waveform graph showing a comparative relationship between the drive voltage and the third winding current.
Figure 20:
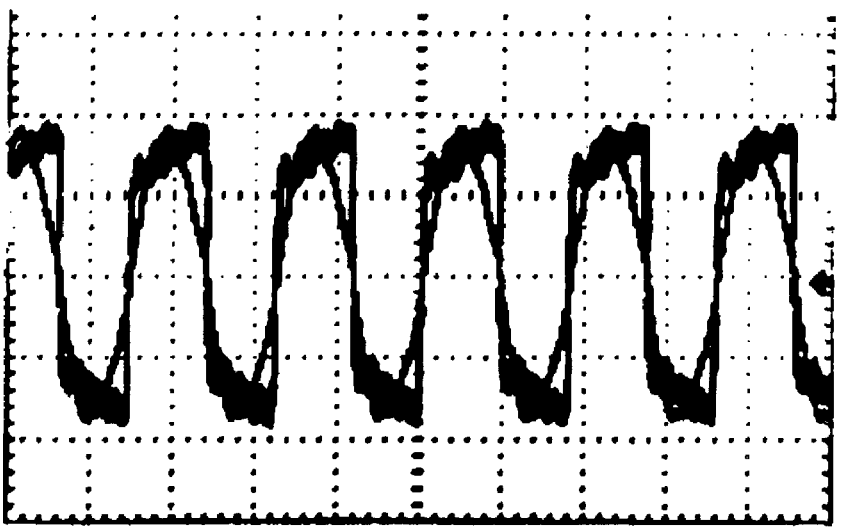
FIG. 20 is a waveform graph showing a comparative relationship between the drive voltage and the third winding current.
Figure 21:
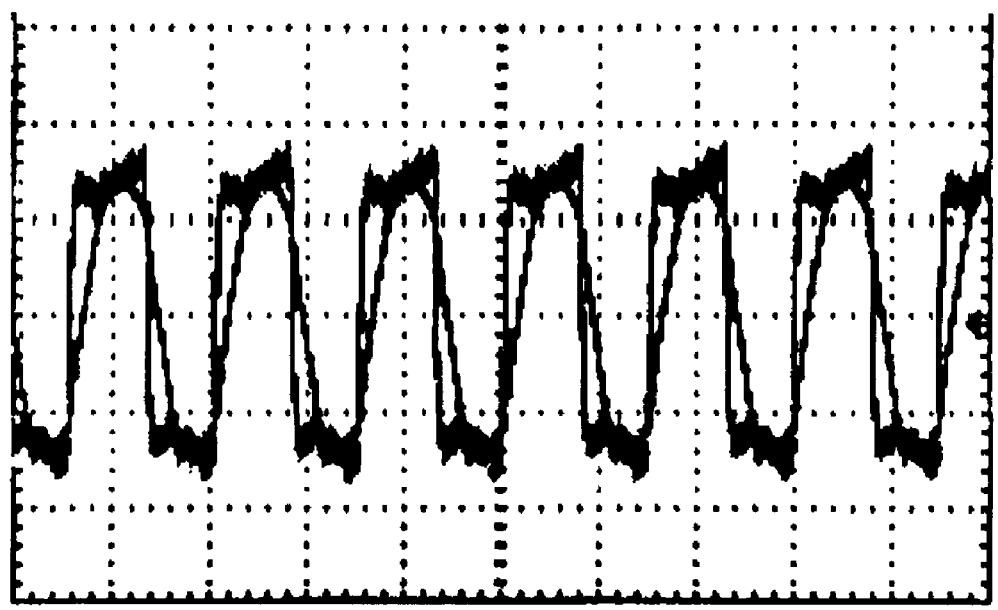
FIG. 21 is a waveform graph showing a comparative relationship between the drive voltage and the third winding current.

The relationship between the current flowing through the third winding Lw and the switching voltage is described below. FIGS. 19, 20, and 21 are waveform graphs showing the relationship between the third winding current and the drive voltage. The horizontal axis represents time and the vertical axis represents voltage or current. The square wave represents the drive voltage and the wave that is nearly sinusoidal represents the third winding current.

FIG. 19 shows a case where the drive frequency is lower than the resonance frequency. Since the phase of the third winding current is ahead of the phase of the drive voltage, the drive frequency increases such that the current phase of the third winding is ahead of the phase of the drive circuit. FIG. 20 shows a case where the drive frequency is equal to the resonance frequency. Since the phase of the third winding current is equal to the phase of the drive voltage, the drive frequency settles at this frequency. FIG. 21 shows a case where the drive frequency is higher than the resonance frequency. Since the phase of the third winding current is behind the phase of the drive voltage, the drive frequency decreases such that the current phase of the third winding drops behind the phase of the drive circuit. In this way, the current resonance circuit of FIG. 16 settles at a determined frequency near the resonance frequency.

In the above examples, it is important to use the phase of the current flowing through the third winding Lw. The third winding Lw may be connected to one of the bases via an impedance circuit Li. The impedance circuit Li may be the same arbitrary circuit as the impedance circuit L. However, the impedance circuit Li desirably uses a choke coil so that the phase relationship of the current flowing through the third winding Lw does not change. In the examples of FIGS. 16, 17, and 18, the diodes D1 and D2 are used to cause the current to flow with inverted phases, but this effect may be achieved in other ways. For example, a more complex circuit such as an integration circuit, a differentiation circuit, or the like may be used as a switching mechanism to achieve waveforms having phases that differ by 90 degrees from the voltage generated by a current detecting winding.

The above examples use bipolar transistors as the switching elements, but other current-controlled switching elements may be used. For example, voltage-controlled switching elements such as FETs (field-effect transistors) may be used. Since FETs have high input impedances, the third winding may have many turns and be connected in parallel to a gate side diode and a resistor. Instead, the voltage of the third winding Lw may be shifted by 90 degrees via the integration circuit to drive the gate. The current flowing through the third winding Lw is used when the switching elements are current-driven elements, but the voltage generated by the third winding Lw may be used by connecting the third winding Lw to a gate of the voltage-driven element via an integration circuit.

Figure 22:
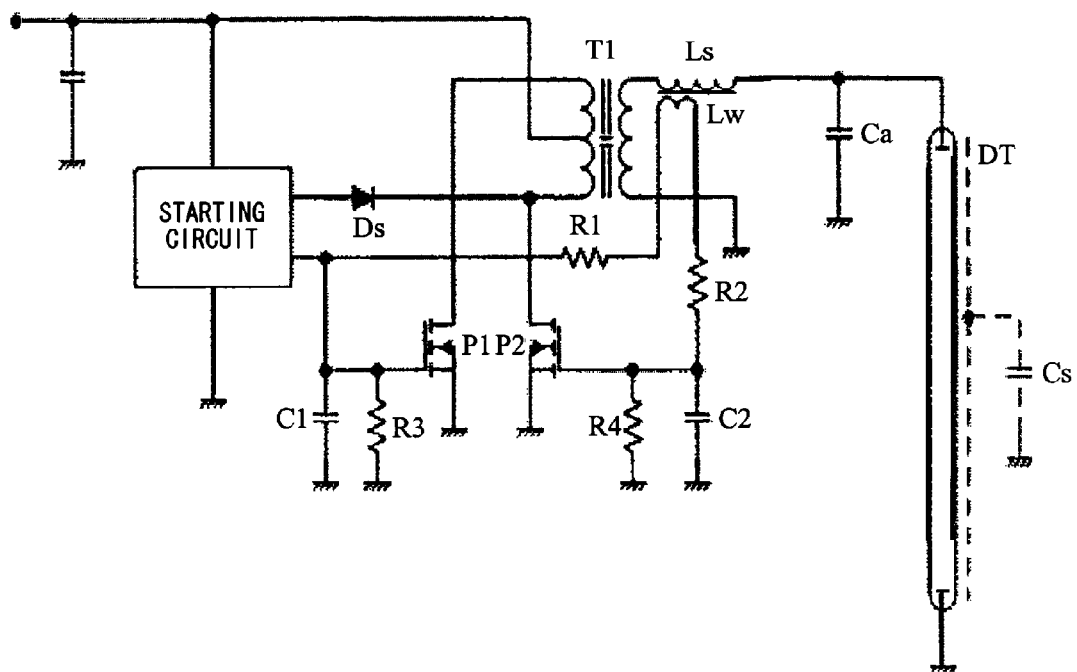
FIG. 22 shows an example adopting a voltage-controlled switching element.

FIG. 22 shows an example in which a voltage-controlled switching element is used. A first integration circuit is formed by a resistor R1 and a capacitor C1, a second integration circuit is formed by a resistor R2 and a capacitor C2, and these integration circuits integrate the voltage generated by the third winding Lw. This voltage drives the voltage-controlled switching elements.

Figure 23:
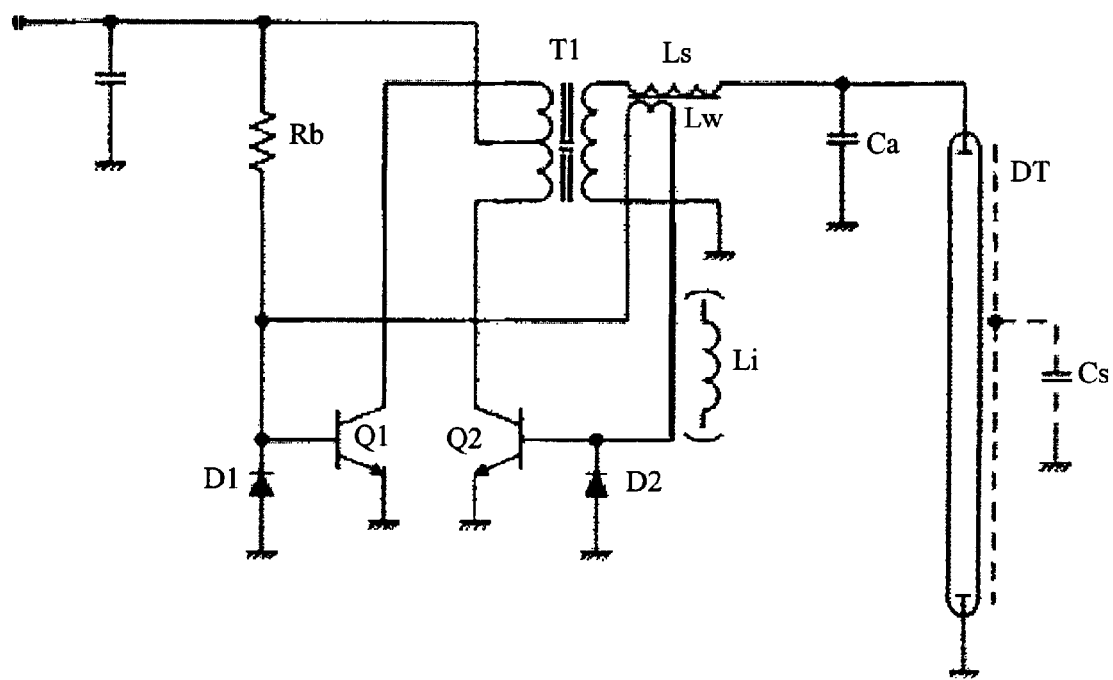
FIG. 23 shows another example of the circuit shown in FIG. 22.

The circuits in the above embodiments are basically current resonance circuits, which usually have a feature of not activating if some sort of activation mechanism is not present. Therefore, a starting circuit is provided. This starting circuit is suitable when the power supply voltage is low, but if the power supply voltage is high, it is desirable to use a starting circuit provided with a DIAC as a normal circuit. However, there are many cases where the circuit of FIG. 23 may be used in practice, even without providing the starting circuit. In such a case, the resistor Rb should cause a small bias current to flow through the transistor Q1 or the transistor Q2.

Figure 24:
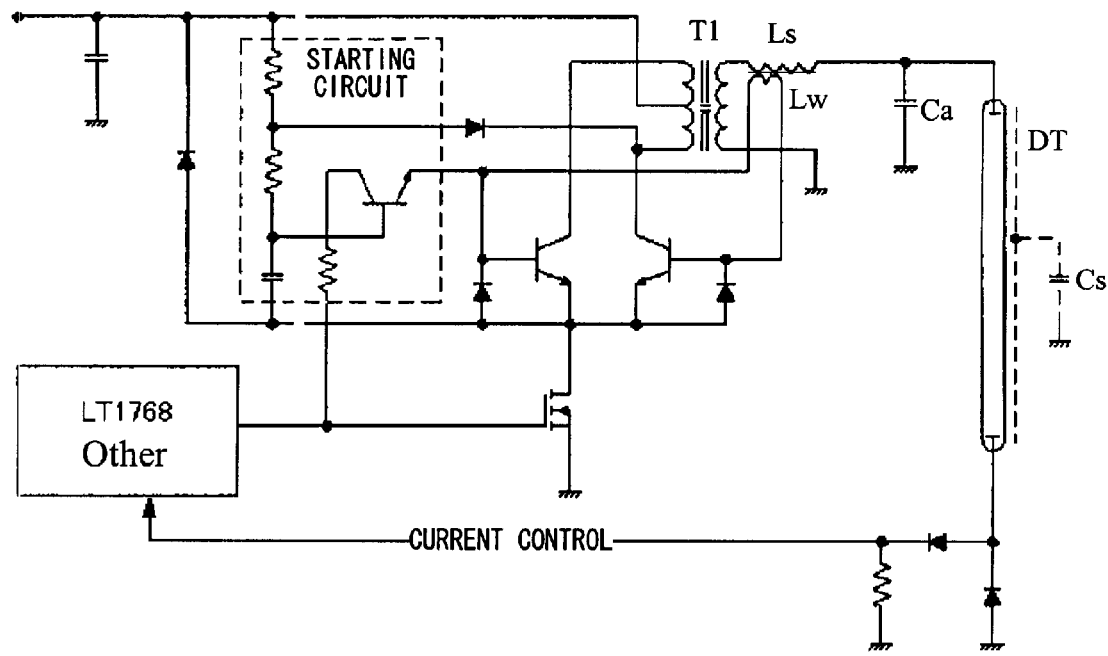
FIG. 24 shows a circuit formed by adding a dimming circuit.

FIG. 24 shows a circuit combined with a dimming circuit. The dimming circuit may be a widely known circuit used conventionally as a collector resonant dimming circuit, or may be a circuit achieved by combining a specialized pulse-width control circuit with a flywheel diode. If the dimming circuit is set ideally, a choke coil and a smoothing capacitor, which are conventionally necessary, are not needed, thereby allowing for a simpler circuit configuration. Furthermore, the transformer is much smaller than a conventional collector resonant circuit. It should be noted that the embodiments of the present invention do not prevent the use of a choke coil. For example, it is appropriate to provide the choke coil if a lower frequency for driving the dimming circuit is desired.

Figure 25:
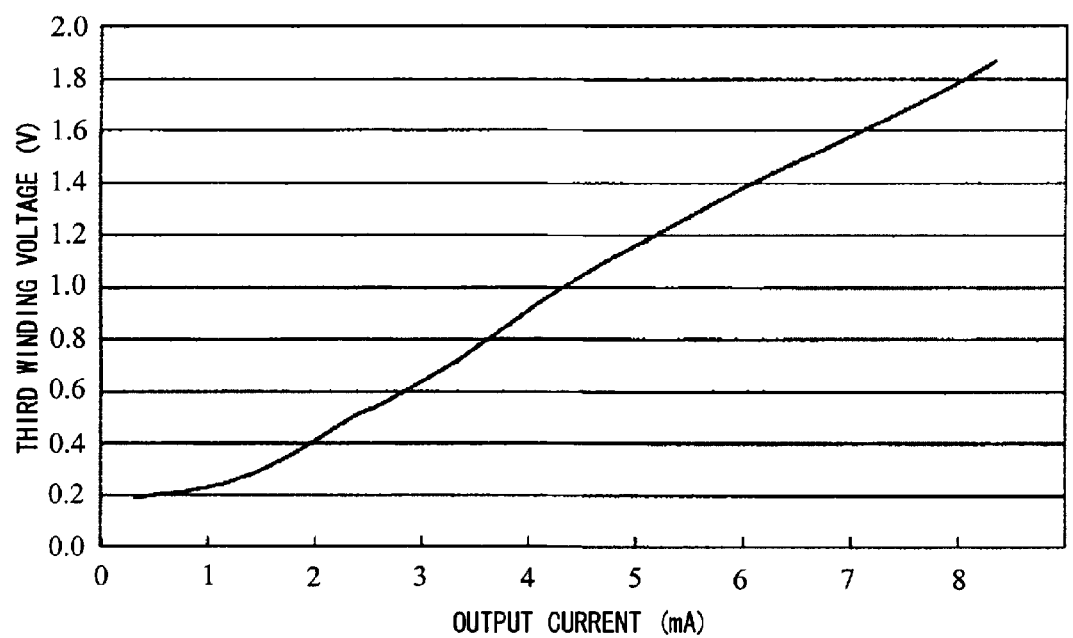
FIG. 25 shows a relationship between the output current of a transformer and the voltage generated by the third winding Lw.

The above embodiments can be used to obtain a voltage proportional to the output current of a transformer, as shown in FIG. 25, by interlinking the third winding Lw with the magnetic flux leakage or by canceling out the main magnetic flux to detect only the magnetic flux leakage. A power factor switching operation can then be realized by using the third winding Lw to detect the resonance current of the secondary side circuit in the transformer. Furthermore, by serially connecting the third winding Lw of a plurality of transformers to form a closed loop, a magnetic flux occurs that opposes the magnetic flux leakage from the third winding Lw, thereby canceling out a portion of the magnetic flux leakage. This canceling out of opposing fluxes causes the amount of magnetic flux leakage of each transformer to be equal, so that the output current of each transformer is also equal.

As described above, the present invention enables formation of a current detecting circuit with a simple configuration that can easily detect the current flowing through the primary winding Pw or the current flowing through the secondary winding Sw, or the phase of this current and voltage. If a plurality of third windings Lw are connected in series to form a closed loop, the lamp current of each discharge lamp can be made equal.

Figure 26:
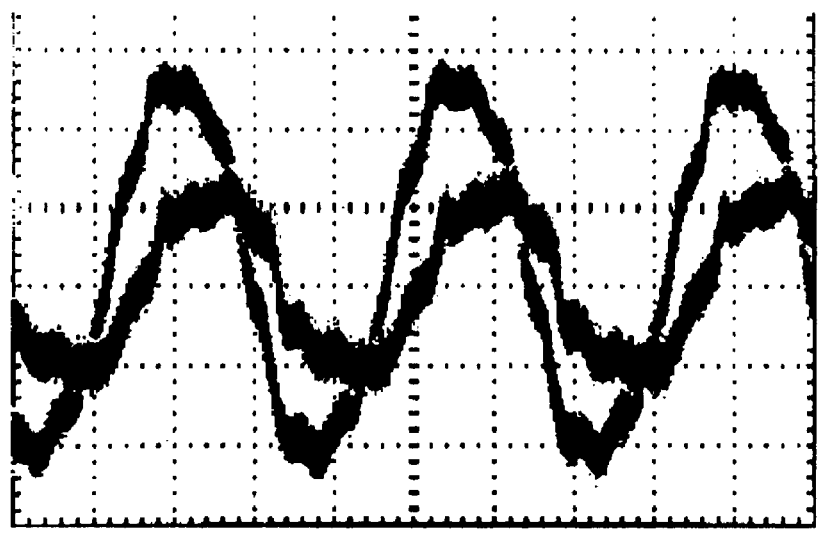
FIG. 26 shows the output current of two transformers when the third windings Lw of the transformers do not form a closed loop.
Figure 27:
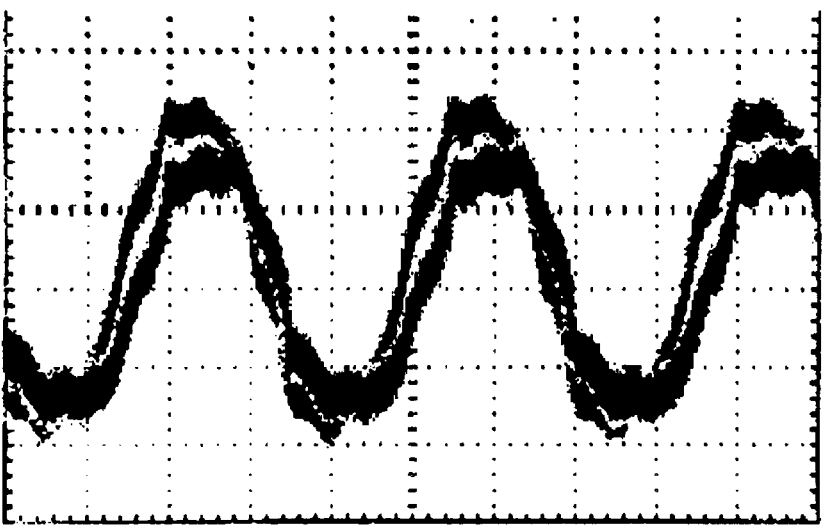
FIG. 27 shows the output current of two transformers when the third windings Lw of the transformers form a closed loop.

FIG. 26 shows the output currents of two transformers whose third windings Lw are not connected in a closed loop. In order to highlight the difference, the length of one of the discharge lamps is set to 340 mm and the length of the other is set to 190 mm, so that the measurement can be made at two states with very different load conditions. The output currents of the two transformers differ greatly. FIG. 27 shows the output currents of two transformers whose third windings Lw are connected in a closed loop. The output currents of the two transformers in this case are approximately equal to each other.

Therefore, a breakthrough is realized in the tradeoff between uniform brightness and heat generation, whereby the output currents of a plurality of transformers can be made substantially equal while maintaining a small leakage inductance. Furthermore, the self-resonant frequency of the secondary winding Sw can be increased. Yet further, the power factor seen from the primary side of a step-up transformer can be effectively improved, and the conversion efficiency during a temperature drop of the circuit can also be improved. The configuration of the current resonant circuit is also simplified. In this case, a further miniaturized step-up transformer can be achieved, or a transformer of the same size but usable with greater power can be achieved. The conversion efficiency of the overall circuit is also improved. In the current resonant circuit, when the load conditions change greatly, the present invention can be used to always maintain a favorable power factor improvement.

While the embodiments of the present invention have been described, the technical scope of the invention is not limited to the above described embodiments. For example, the transformer including the third winding Lw is obviously not limited to a step-up converter, and is not limited to use in a dimming circuit for a discharge lamp. The above embodiments described examples of an inverter circuit for used in a discharge lamp, but the present invention can also be applied to other types of transformers such as a transformer used in normal electric power transmission, a switching power source for a microwave, or an IH cooking heater. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A transformer, comprising:
   a first winding and a second winding that interlink with a main magnetic flux; and
   a third winding that interlinks with a magnetic flux leakage interlinking with only one of the first winding and the second winding.

2. The transformer according to claim 1, further comprising a core through which passes the main magnetic flux and the magnetic flux leakage, wherein
   the core has a convex magnetic flux leakage section that causes the magnetic flux leakage.

3. The transformer according to claim 1, wherein
   the third winding interlinks with the magnetic flux leakage but not with the main magnetic flux.

4. The transformer according to claim 1, wherein
   the magnetic flux leakage includes a first magnetic flux leakage that interlinks with the first winding, but not with the second winding, and a second magnetic flux leakage that interlinks with the second winding, but not with the first winding,
   the third winding includes:
   a first partial winding portion that interlinks with the main magnetic flux and the first magnetic flux leakage but not with the second magnetic flux leakage; and a second partial winding portion that interlinks with the main magnetic flux and the second magnetic flux leakage but not with the first magnetic flux leakage, and the first partial winding portion and the second partial winding portion are wound in directions opposite to each other.

5. The transformer according to claim 1, wherein the magnetic flux leakage includes a first magnetic flux leakage that interlinks with the first winding, but not with the second winding, and a second magnetic flux leakage that interlinks with the second winding, but not with the first winding, the third winding includes:
  a first partial winding portion that interlinks with the main magnetic flux and the first magnetic flux leakage but not with the second magnetic flux leakage; and
  a second partial winding portion that interlinks with the main magnetic flux, but not with the first magnetic flux leakage or the second magnetic flux leakage, and the first partial winding portion and the second partial winding portion are wound in directions opposite to each other.

6. The transformer according to claim 4, wherein the first partial winding portion is wound around the same axis as the first winding, and the second partial winding portion is wound around the same axis as the second winding.

7. The transformer according to claim 5, wherein the first partial winding portion is wound around the same axis as the first winding, and the second partial winding portion is wound around the same axis as the second winding.

8. The transformer according to claim 1, wherein the magnetic flux leakage includes a first magnetic flux leakage that interlinks with the first winding, but not with the second winding, and a second magnetic flux leakage that interlinks with the second winding, but not with the first winding, and the third winding interlinks with the main magnetic flux and the second magnetic flux leakage but not with the first magnetic flux leakage.

9. The transformer according to claim 2, wherein the third winding interlinks with the magnetic flux leakage but not with the main magnetic flux.

10. The transformer according to claim 2, wherein the magnetic flux leakage includes a first magnetic flux leakage that interlinks with the first winding, but not with the second winding, and a second magnetic flux leakage that interlinks with the second winding, but not with the first winding, the third winding includes:
  a first partial winding portion that interlinks with the main magnetic flux and the first magnetic flux leakage but not with the second magnetic flux leakage; and
  a second partial winding portion that interlinks with the main magnetic flux and the second magnetic flux leakage but not with the first magnetic flux leakage, and the first partial winding portion and the second partial winding portion are wound in directions opposite to each other.

11. The transformer according to claim 2, wherein the magnetic flux leakage includes a first magnetic flux leakage that interlinks with the first winding, but not with the second winding, and a second magnetic flux leakage that interlinks with the second winding, but not with the first winding, the third winding includes:
  a first partial winding portion that interlinks with the main magnetic flux and the first magnetic flux leakage but not with the second magnetic flux leakage; and
  a second partial winding portion that interlinks with the main magnetic flux, but not with the first magnetic flux leakage or the second magnetic flux leakage, and the first partial winding portion and the second partial winding portion are wound in directions opposite to each other.

12. The transformer according to claim 10, wherein the first partial winding portion is wound around the same axis as the first winding, and the second partial winding portion is wound around the same axis as the second winding.

13. The transformer according to claim 11, wherein the first partial winding portion is wound around the same axis as the first winding, and the second partial winding portion is wound around the same axis as the second winding.

14. The transformer according to claim 2, wherein the magnetic flux leakage includes a first magnetic flux leakage that interlinks with the first winding, but not with the second winding, and a second magnetic flux leakage that interlinks with the second winding, but not with the first winding, and the third winding interlinks with the main magnetic flux and the second magnetic flux leakage but not with the first magnetic flux leakage.

15. An electric circuit, comprising:

a transformer that includes:
  a first winding and a second winding that interlink with a main magnetic flux; and
  a third winding that interlinks with a magnetic flux leakage interlinking with only one of the first winding and the second winding; and a detecting section that detects one of a current and a voltage generated by the third winding.

16. The electric circuit according to claim 15, further comprising a current measuring circuit that measures a current flowing through the second winding, based on the current or the voltage generated by the third winding.

17. The electric circuit according to claim 15, further comprising a current measuring circuit that measures a current flowing through the second winding, based on a difference between the voltage generated by the third winding and a voltage generated by the first winding.

18. The electric circuit according to claim 15, further comprising a control circuit that controls an output of the second winding by controlling an input of the first winding, based on the current or the voltage generated by the third winding.

19. The electric circuit according to claim 18, wherein the control circuit includes a first switching element and a second switching element, which each have a pair of input/output terminals and a control terminal, a mid-point of the first winding is connected to a power source, one of the input/output terminals of the first switching element is grounded, one of the input/output terminals of the second switching element is grounded, the other input/output terminal of the first switching element is connected to one terminal of the first winding, the other input/output terminal of the second switching element is connected to an other terminal of the first winding, the control terminal of the first switching element is connected to one terminal of the third winding, and the control terminal of the second switching element is connected to an other terminal of the third winding.

20. The electric circuit according to claim 19, wherein the control circuit further includes an impedance circuit inserted (i) between the control terminal of the first switching element and the one terminal of the third winding or (ii) between the control terminal of the second switching element and the other terminal of the third winding.

21. The electric circuit according to claim 15, comprising a plurality of the transformers, wherein the third windings of the plurality of transformers are connected to each other in series to form a closed circuit for causing an output current from the second winding in each transformer to be equal.

22. The electric circuit according to claim 21, further comprising an impedance circuit inserted into the closed circuit.

23. A method for measuring or controlling a current in the electric circuit according to claim 15, based on at least one of a current and a voltage generated by the third winding.

24. The method according to claim 23, wherein the current flowing through the second winding is measured by measuring the current or the voltage generated by the third winding.

25. The method according to claim 23, wherein the current flowing through the second winding is measured by measuring a difference between the voltage generated by the third winding and a voltage generated by the first winding.

26. The method according to claim 23, wherein an output of the second winding is controlled by controlling an input of the first winding based on the voltage or the current generated by the third winding.

27. The method according to claim 23, wherein the electric circuit is provided with a plurality of the transformers, and the third windings of the plurality of transformers are connected to each other in series to form a closed circuit for causing an output current from the second winding in each transformer to be equal.

\* \* \* \* \*